United States Patent
Brueggen

(10) Patent No.: US 10,666,294 B2
(45) Date of Patent: May 26, 2020

(54) ERROR CORRECTION CODE WORDS WITH BINOMIAL BIT ERROR DISTRIBUTION

(71) Applicant: Hewlett Packard Enterprise Development LP, Houston, TX (US)

(72) Inventor: Chris M. Brueggen, Allen, TX (US)

(73) Assignee: Hewlett Packard Enterprise Development LP, Houston, TX (US)

(*) Notice: Subject to any disclaimer, the term of this patent is extended or adjusted under 35 U.S.C. 154(b) by 96 days.

(21) Appl. No.: 15/908,805

(22) Filed: Feb. 28, 2018

(65) Prior Publication Data
US 2019/0268018 A1 Aug. 29, 2019

(51) Int. Cl.
| H03M 13/01 | (2006.01) |
| G11C 29/52 | (2006.01) |
| G06F 11/10 | (2006.01) |
| G06F 11/22 | (2006.01) |

(52) U.S. Cl.
CPC ....... H03M 13/015 (2013.01); G06F 11/1068 (2013.01); G06F 11/2215 (2013.01); G11C 29/52 (2013.01)

(58) Field of Classification Search
CPC .. G06F 11/2215; G06F 11/10; G06F 11/1068; G11C 29/02; G11C 29/42; G11C 29/52; H03M 13/01; H03M 13/015
See application file for complete search history.

(56) References Cited

U.S. PATENT DOCUMENTS

| 8,572,529 | B2 | 10/2013 | Zawalski et al. | |
| 8,627,163 | B2 | 1/2014 | Ito et al. | |
| 8,918,707 | B2* | 12/2014 | Moyer | G06F 11/2215 714/801 |
| 9,092,312 | B2 | 7/2015 | Meaney et al. | |
| 9,159,458 | B2 | 10/2015 | Griffin et al. | |
| 2004/0243887 | A1* | 12/2004 | Sharma | H03M 13/47 714/52 |

FOREIGN PATENT DOCUMENTS

WO WO17131639 8/2017

OTHER PUBLICATIONS

Nair et al., A fast, configurable memory reliability simulator for conventional and 3D-stacked systems, Dec. 2015, ACM Trans on architecture and code optimization, vol. 12, No. 4, article 44, pp. 44:1 to 44:24.*

Li, S. et al., System Implications of Memory Reliability in Exascale Computing,http://dbarthou.vvv.enseirb-matmeca.fr/PRCD/a46-li.pdf (Nov. 12, 2018).

* cited by examiner

*Primary Examiner* — Shelly A Chase
(74) *Attorney, Agent, or Firm* — Hewlett Packard Enterprise Patent Development

(57) ABSTRACT

An error injected error correction code (ECC) word generator generates a set of ECC code words injected with bit errors for being read by an ECC decoder and error reporting hardware. The set of the error injected ECC words has a binomial distribution with regard to a number of the bit errors in a given ECC word of the set. The set of error injected ECC words has a predetermined average ratio of bit errors.

20 Claims, 5 Drawing Sheets

| BER | Codeword size (bits) | Aggregate read BW (GB/s) | N bit errors per codeword | GB (2**24 codewords) | Occurrences in 1 second | Occurrences in 1 year |
|---|---|---|---|---|---|---|
| 5.00E-04 | 768 | 320 | 0 | 1.14E+07 | 3.66E+09 | 1.15E+17 |
| | | | 1 | 4.39E+06 | 1.40E+09 | 4.43E+16 |
| | | | 2 | 8.43E+05 | 2.70E+08 | 8.50E+15 |
| | | | 3 | 1.08E+05 | 3.45E+07 | 1.09E+15 |
| | | | 4 | 1.04E+04 | 3.31E+06 | 1.04E+14 |
| | | | 5 | 7.95E+02 | 2.54E+05 | 8.02E+12 |
| | | | 6 | 5.09E+01 | 1.63E+04 | 5.14E+11 |
| | | | 7 | 2.79E+00 | 8.93E+02 | 2.82E+10 |
| | | | 8 | 1.34E-01 | 4.29E+01 | 1.35E+09 |
| | | | 9 | 5.72E-03 | 1.83E+00 | 5.77E+07 |
| | | | 10 | 2.20E-04 | 7.03E-02 | 2.22E+06 |
| | | | 11 | 7.66E-06 | 2.45E-03 | 7.73E+04 |
| | | | 12 | 2.45E-07 | 7.85E-05 | 2.47E+03 |
| | | | 13 | 7.24E-09 | 2.32E-06 | 7.31E+01 |
| | | | 14 | 1.99E-10 | 6.36E-08 | 2.01E+00 |
| | | | 15 | 5.09E-12 | 1.63E-09 | 5.13E-02 |

FIG. 8

ERROR CORRECTION CODE WORDS WITH BINOMIAL BIT ERROR DISTRIBUTION

BACKGROUND

Nonvolatile memory may sometimes experience bit errors in the digital data stored by the nonvolatile memory. Error correction code decoders identify such bit errors and correct such errors. Poor performance by an error correction code decoder may result in slower performance or system failure.

BRIEF DESCRIPTION OF THE DRAWINGS

FIG. 8 is a table showing an example of bit error occurrences in a particular nonvolatile memory with an example code word size.

Figure 1:
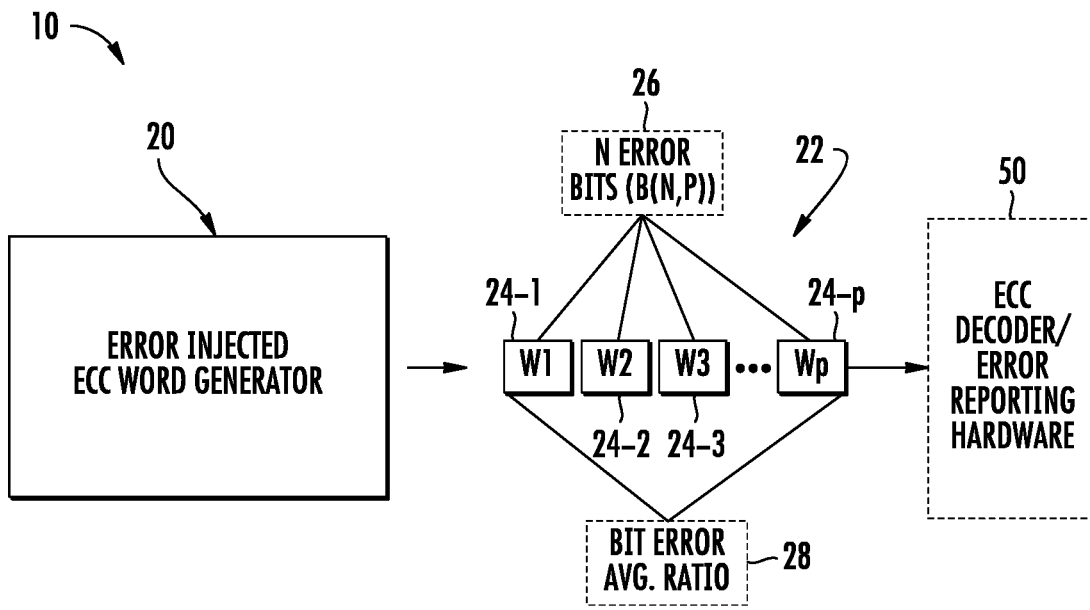
FIG. 1 is a schematic diagram illustrating portions of an example bit error emulation system.

Throughout the drawings, identical reference numbers designate similar, but not necessarily identical, elements. The figures are not necessarily to scale, and the size of some parts may be exaggerated to more clearly illustrate the example shown. Moreover, the drawings provide examples and/or implementations consistent with the description; however, the description is not limited to the examples and/or implementations provided in the drawings.

DETAILED DESCRIPTION OF EXAMPLES

Disclosed are example error injected error correction code (ECC) word generators and methods that facilitate accurate and realistic testing of ECC decoders and error reporting hardware, as well the computer and/or memory systems including such ECC decoders and error reporting hardware. The example error injected ECC word generators reliably and controllably emulate real world bit errors with respect to nonvolatile memories. As a result, the disclosed error injected ECC word generators and methods facilitate more accurate and realistic performance evaluation of such decoders and error reporting hardware at high speed to facilitate the development of enhanced ECC decoders as well as filtering/buffering hardware to report errors to software.

For purposes of this disclosure, a "word" is a natural unit of data used by a particular processor design. A word may be a fixed size piece of data handled as a unit by an instruction set our hardware of a processor. For example, in one implementation, a word may have a word size of 32 or 64 bits. An ECC word is a word that is decoded by an ECC decoder to identify bit errors and to possibly correct such bit errors.

The disclosed error injected ECC word generators and methods provide emulation platforms that inject bit errors into ECC words to emulate particular nonvolatile memories that are to be analyzed for errors and corrected by a candidate ECC decoder. The disclosed error injected ECC code word generators and methods inject such errors into the ECC code words such that a set of error injected ECC words has a binomial distribution with respect to a number of bit errors in a given ECC word of the set. This binomial distribution more realistically reflects the randomness at which bit errors may occur in such a nonvolatile memory. Error injected ECC word generators and methods further inject errors at an overall rate such that the set of ECC words has a predetermined average ratio of bit errors, emulating the expected ratio of bit errors for a particular selected type of nonvolatile memory that is to be decoded by the candidate ECC decoder. As a result, a candidate ECC decoder may be tested with a variety of different nonvolatile memory types at high speed, facilitating the identification of those nonvolatile memory types and ECC decoders that provide enhanced performance.

The artificial error injection may be accomplished by flipping bits in the ECC word prior to its decode. In one implementation, such random error rejection occurs as read data enters a generator or controller before the data is passed to the ECC decoder. In one implementation, the error injected ECC word generator comprises a series of parallel error injectors. Each of the error injectors outputs a bit error for a random location of an error pattern that is to be applied to an ECC word to be read by the ECC decoder and error reporting hardware. In one implementation, the parallel injectors are chained together such that each injector has a unique random error location at any given point in time. Each injector performs injections on its own randomized schedule. Each of the injectors is to output the bit error based upon a predetermined average ratio for a set of ECC words. A particular predetermined average bit error ratio may modeled by enabling N of the injectors, with each injector injecting with an average ratio (BER*code word size)/N, where the number N places a limit on the number of errors that may be actually injected in a given ECC word. The parallel error injectors collectively inject the bit errors to produce a binomial distribution of bit errors amongst the set of ECC words. An error pattern applicator flips bits of each ECC word in parallel based upon the respective error pattern. In one implementation, the error pattern applicator XORs the bits of the ECC word and the respective error pattern.

In one implementation, each of the parallel error injectors may each comprise a digital counter which control the frequency of bit error injection, wherein the digital counter has a counting range. Each of the parallel injectors further include circuitry to output a random frequency counter reload value for the digital counter. The pseudorandom frequency counter reload value is limited to a portion of the counting range based upon the predetermined average ratio for the set of ECC words. In one implementation, each of the parallel injectors further comprises a linear feedback shift register that output a pseudorandom location for the bit error to be injected or locations for multiple bit errors to be injected into each ECC word. The random location in the error pattern is different for each of the parallel error injectors.

In some implementations, the ECC word generator concurrently emulates the random presence of bit errors in digital data being read from memory, the presence of bit errors resulting from a failing memory device or component and the presence of bit errors resulting from write wear out at a predefined memory address. To emulate the presence of bit errors resulting from failing memory device or component, the ECC word generator concurrently injects ECC words read from a selected one of a plurality of memory devices with a number of bit errors greater than a predetermined memory device failure threshold. To emulate the presence of bit errors resulting from write wear out at a predefined memory location, the ECC word generator concurrently consistently injects a bit error in those locations of those ECC words that are read from a predefined memory location of a nonvolatile memory.

In one implementation, ECC words are supplied or provided by reading such ECC words from a memory that is predetermined to be relatively error-free such that the presence of random errors, other than those artificially injected by the ECC word generator are minimized. By minimizing the number of extraneous random bit errors in the final ECC words that are evaluated by the ECC decoder/error reporting hardware, such evaluation of the ECC decoder/error reporting hardware may be more accurate and consistent. By minimizing the number of extraneous random bit errors in the final ECC words, the average number of bit errors may be more reliably controlled to better emulate and match the number of bit errors expected to be found in a nonvolatile memory that has a higher rate of bit errors. In one implementation, the ECC words are supplied or provided by reading from a dynamic random access memory, wherein dynamic random access memory has few if any bit errors such that the final ECC words generated may be provided with a precisely controlled average number of bit errors or a precisely controlled bit error ratio that more closely emulates the number of bit errors expected to be found in a selected type of nonvolatile memory (not DRAM).

Disclosed is an example error injected error correction code (ECC) word generator which generates a set of ECC code words injected with bit errors for being read by an ECC decoder and error reporting hardware. The set of the error injected ECC words has a binomial distribution with regard to a number of the bit errors in a given ECC word of the set. The set of error injected ECC words has a predetermined average ratio of bit errors.

Disclosed is an example method that may involve providing error correction code (ECC) words to be read by an ECC decoder and error reporting hardware. For each of the error correction code words the method further involves: (1) forming an error pattern having locations corresponding to locations of the ECC word by forming errors at random locations of the error pattern; and (2) applying the error pattern to the error correction code by flipping bits of those locations of the ECC word that correspond to locations of the error pattern at which a bit error was formed to form an error injected ECC word. Each set of the error injected ECC words has a binomial distribution of a particular number of the bit errors in a given ECC word of the set, wherein the set of error injected ECC words has a predetermined average ratio of bit errors.

Disclosed is an example a bit error emulation generator that may include parallel error injectors. Each of the error injectors is to output a bit error for a random location of an error pattern to be applied to an error correction code (ECC) word to be read by an ECC decoder and error reporting hardware. Each of the injectors is to output the bit error with a predetermined average ratio for a set of ECC words, the parallel error injectors collectively injecting the bit errors to produce a binomial distribution of a particular number of the bit errors in a given ECC word of the set. An error pattern applicator is provided to flip bits of the ECC word in parallel based on the error pattern.

FIG. 1 schematically illustrates portions of an example bit error emulation system 10 which facilitates the emulation of bit errors in digital data being read from a memory to facilitate the testing of ECC decoders and error reporting hardware as well as to facilitate the testing of performance of an overall system having particular types of nonvolatile memory in particular ECC decoders and error reporting hardware. FIG. 1 schematically illustrates an example error injected ECC word generator 20. ECC word generator 20 comprises an integrated circuit that outputs or generates a set 22 of ECC code words 24-1, 24-2, 24-3 . . . 24-$p$ (W1-Wp) (collectively referred to as words 24) that are injected with artificially introduced bit errors, wherein such errors are to be read by a candidate ECC decoder/error reporting hardware 50 (shown in broken lines) that is undergoing evaluation along with the system that includes the candidate ECC decoder/error reporting hardware 50. As indicated by block 24, the sets 22 of error injected ECC words 24 has a binomial distribution B(n,p) with regard to a number of the bit errors in a given ECC word of the set 22, wherein n is the number of bit errors in a given ECC word and wherein p is a number of ECC words in the set 22. This binomial distribution more realistically reflects the randomness at which bit errors may occur in a nonvolatile memory.

As indicated by block 28, such errors are injected into the ECC words 24 of each set 22 with an overall ratio such that the set 22 of ECC words has a predetermined average ratio of bit errors, emulating the expected ratio of bit errors for a particular selected type of nonvolatile memory that is to be decoded by the candidate ECC decoder. As a result, a candidate ECC decoder may be tested with a variety of different nonvolatile memory types, facilitating the identification of those combinations of nonvolatile memory types and ECC decoders that provide enhanced performance.

Figure 2:
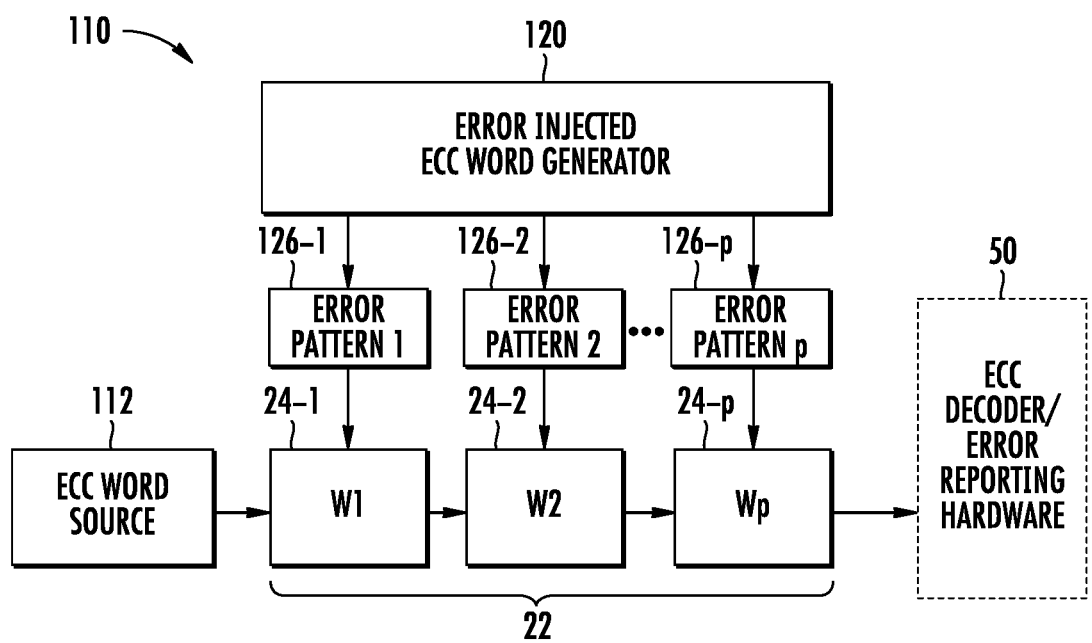
FIG. 2 is a schematic diagram illustrating portions of an example bit error emulation system.

FIG. 2 schematically illustrates portions of an example bit error emulation system 110. System 110 comprises ECC word source 112, error injected ECC word generator 120 and ECC decoder/error reporting hardware 50. ECC word source 112 comprises a source of ECC words for being injected with errors by generator 120 and for being ultimately being read by ECC decoder/error reporting hardware 50 to evaluate decoder 50. In one implementation, such ECC words are artificially created by an integrated circuit, where the ECC words have few if any bit errors. In another implementation, such ECC words are read from a memory or memory system having at least one memory device. In one implementation, the memory or memory devices are of a type that has few if any bit errors to facilitate more precise control over the bit error ratio of those emulated ECC words being read by decoder 50 during testing of decoder 50. In one implementation, the ECC word source 112 may comprise a dynamic random access memory, wherein the source ECC words are read from the dynamic random access memory prior to being injected with bit errors by generator 120.

Error injected ECC word generator 120 comprises an integrated circuit that outputs or generates a set 22 of ECC code words 24-1, 24-2, . . . 24-$p$ (W1-Wp) (collectively referred to as words 24) that are injected with artificially introduced bit errors, wherein such errors are to be read by a candidate ECC decoder/error reporting hardware 50 (shown in broken lines) that is undergoing evaluation along with the system that includes the candidate ECC decoder/error reporting hardware 50. As shown by FIG. 2, for each ECC word provided by source 112, generator 120 outputs an error pattern 126 (error pattern 126-1, 126-2, . . . 126-$p$) (collectively referred to as error patterns 126. Each of error patterns 126 comprises a set of error pattern bits, wherein each bit (location) of the set of error pattern bits corresponds to a bit (location) of the respective ECC word. The set of error patterns 126 for the set 22 of ECC words 24 is provided with a binomial distribution with regard to a number of bit errors in a given error pattern 126 which results in set 22 of ECC words sent to decoder 50 also having a binomial distribution with regard to a number of bit errors in a given ECC word of the set. The error patterns 126 are injected with bit errors such that the set of bit errors 126 for the set 22 of ECC words 24 has a predetermined average ratio of bit errors. As a result, the set 22 of words 24 also have the predetermined average ratio of bit errors. The predetermined average ratio of bit errors or bit error ratio is a ratio of an average number of bit errors to the size of the ECC word. This predetermined average ratio may be selected so as to simulate the expected average bit error ratio for a particular type of nonvolatile memory proposed to be utilized with the decoder 50. In one implementation, each error pattern is applied to its respective ECC word 24 by applying an XOR function to the combination of each of the air patterns 126 to their respective ECC words 24.

Figure 3:
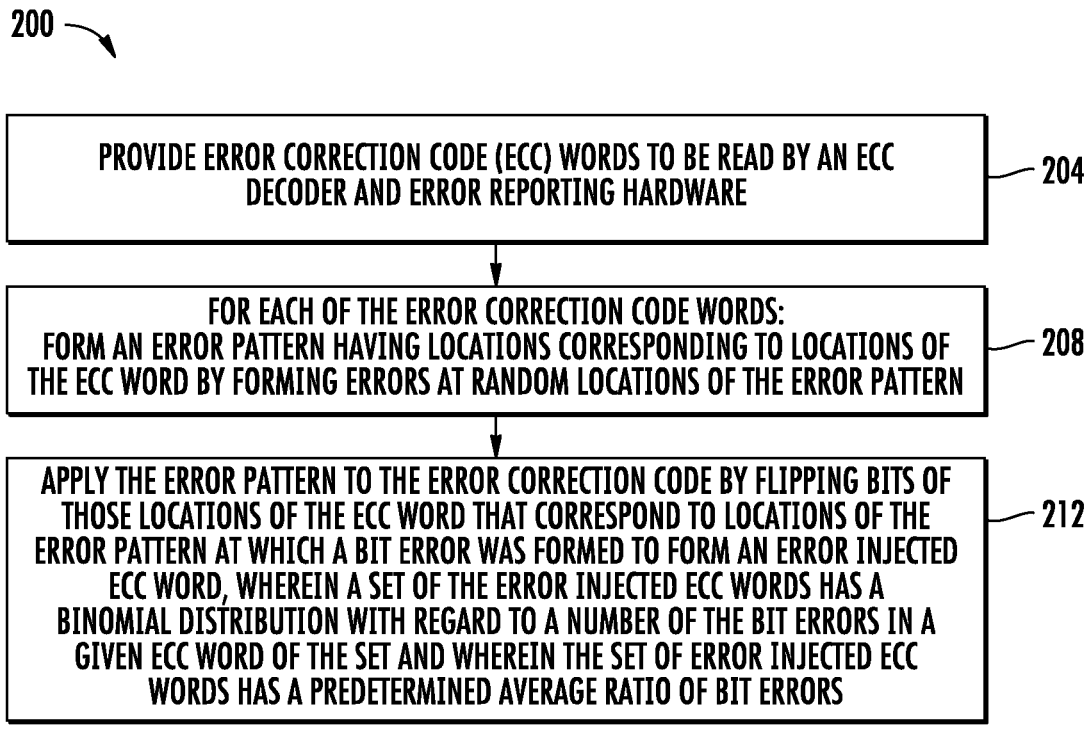
FIG. 3 is a flow diagram of an example bit error emulation method.

FIG. 3 is a flow diagram of an example bit error emulation method 200. Bit error emulation method 200 facilitates accurate and realistic testing of ECC decoders and error reporting hardware, as well the computer and/or memory systems including such ECC decoders and error reporting hardware. Bit error emulation method 200 reliably and controllably emulates real world bit errors with respect to nonvolatile memories. As a result, bit error emulation method 200 facilitates more accurate and realistic performance evaluation of decoders to facilitate the development of enhanced ECC decoders and computer memory systems. Although method 200 is described in the context of being carried out by system 110, it should be appreciated that method 200 may be carried out with any of the bit error emulation systems and ECC word generators describing this disclosure or with similar systems and ECC word generators.

As indicated by block 204, ECC words to be read by an ECC decoder and error reporting hardware 50 are provided. In one implementation, such ECC words are artificially created by an integrated circuit, where the ECC words have few if any bit errors. In another implementation, such ECC words are read from a memory or memory system having at least one memory device. In one implementation, the memory or memory devices are of a type that has few if any bit errors to facilitate more precise control over the bit error ratio of those emulated ECC words being read by decoder 50 during testing of decoder 50. In one implementation, the ECC words are supplied by a dynamic random access memory, wherein the source ECC words are read from the dynamic random access memory.

As indicated by block 208, for each of the raw or base ECC words provided in block 204 (words prior to the introduction of artificial bit errors), generator 120 forms an error pattern (such as one of error patterns 126) having locations corresponding to locations of the raw or base ECC word by forming errors at random locations of the error pattern. As indicated by block 212, the error pattern associated with each ECC word is applied to the ECC word by flipping bits of those locations of the ECC word that correspond to locations of the error pattern at which a bit error was formed so as to form an error injected ECC word. The injection of errors is controlled such that a set of error injected ECC words has a binomial distribution with regard to a number of the bit errors in a given ECC word of the set. The set of error injected ECC words has a predetermined average ratio of bit errors. In one implementation, the predetermined average ratio bit errors may correspond to an expected average ratio of bit errors associated with a nonvolatile memory which is to be used with the decoder 50 under test.

Figure 4:
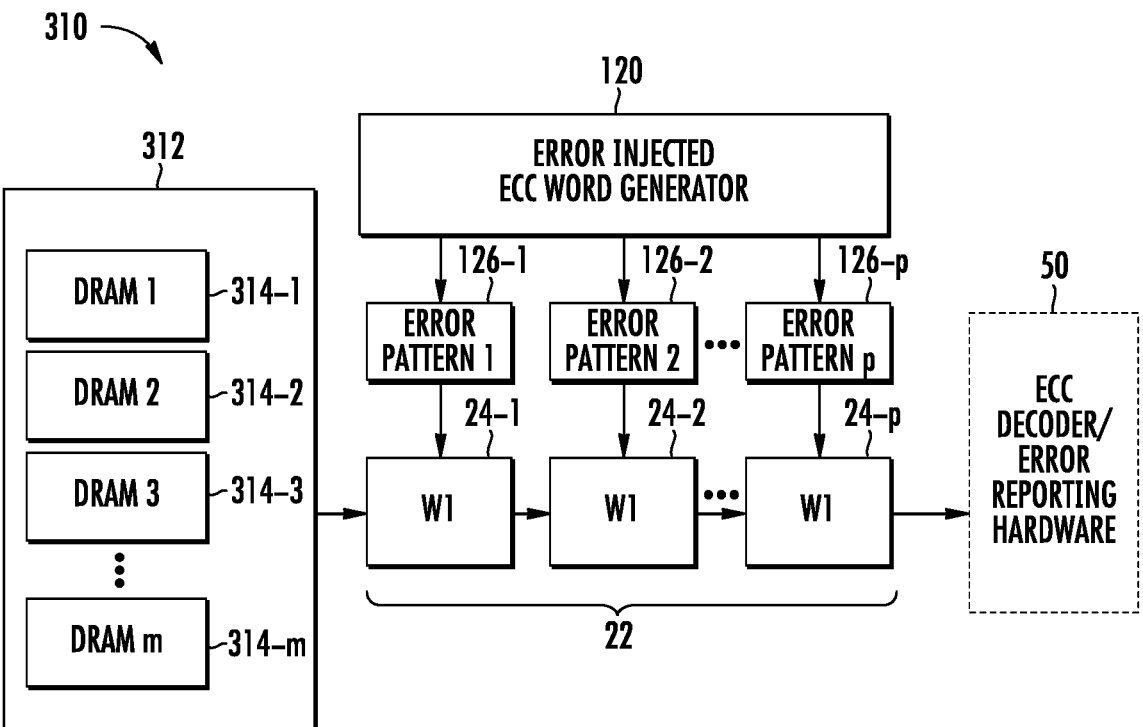
FIG. 4 is a schematic diagram illustrating portions of an example bit error emulation system.

FIG. 4 schematically illustrates bit error emulation system 300. Bit error emulation system 310 is similar to bit error emulation system 110 described above except that bit error emulation system 300 includes an ECC word source 312 for supplying raw or base ECC words to be injected with bit errors by generator 120. Those remaining components of system 310 which correspond to components of system 110 are numbered similarly.

ECC word source 312 comprises a memory or a collective memory of multiple individual memory devices 314-1, 314-2, 314-3 . . . 314-m (collectively referred to as memory devices 314). In the example illustrated, each of the memory devices is selected based upon having a characteristic of very few if any bit errors in the words read from such memory devices. In the example illustrated, each of memory devices 314 comprises a dynamic random access memory, wherein each dynamic random access memory stores or sources raw or base ECC words having few or no bit errors.

By minimizing the number of extraneous random bit errors (bit errors other than those introduced by generator 120) in the final ECC words that are evaluated by the ECC decoder/error reporting hardware, such evaluation of the ECC decoder/error reporting hardware may be more accurate and consistent. By minimizing number of extraneous random bit errors in the final ECC words, the average number of bit errors may be more reliably controlled to better emulate and match the number of bit errors expected to be found in a nonvolatile memory that has a higher ratio of bit errors. In one implementation, the ECC words are supplied or provided by reading from a dynamic random access memory, wherein dynamic random access memory has few if any bit errors such that the final ECC words generated may be provided with a precisely controlled average number of bit errors or a precisely controlled bit error ratio that more closely emulates the number of bit errors expected to be found in a selected type of nonvolatile memory (not DRAM).

Figure 5:
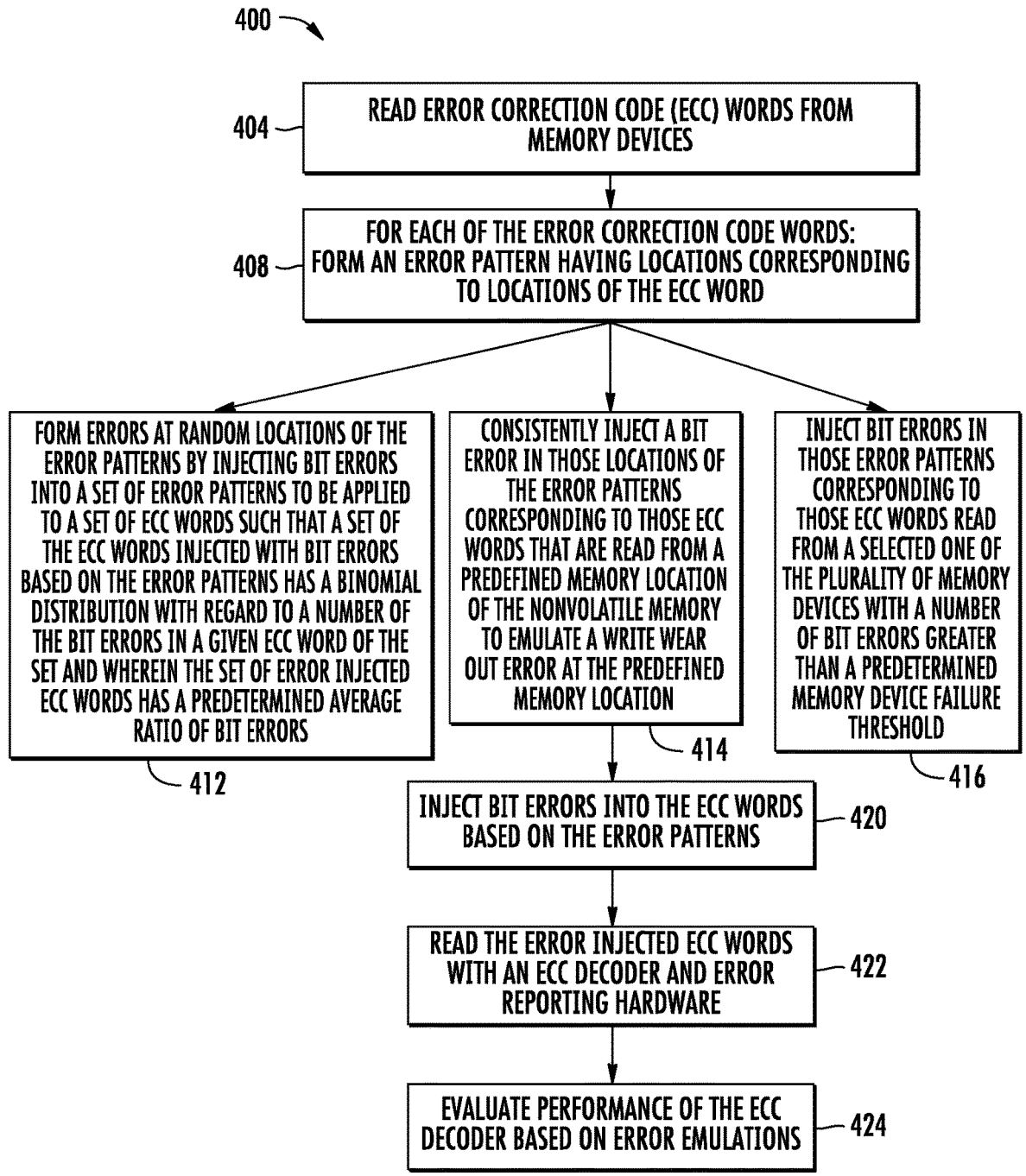
FIG. 5 is a flow diagram of an example bit error emulation method.

FIG. 5 is a flow diagram of an example bit error emulation and testing method 400. Bit error emulation and testing method 400 facilitates accurate and realistic testing of ECC decoders and error reporting hardware, as well as the computer and/or memory systems including such ECC decoders and error reporting hardware. Bit error emulation and testing method 400 reliably and controllably emulates real world bit errors with respect to nonvolatile memories. As a result, bit error emulation method 400 facilitates more accurate and realistic performance evaluation or testing of decoders to facilitate the development of enhanced ECC decoders and computer memory systems. Although method 400 is described in the context of being carried out by system 310, it should be appreciated that method 400 may be carried out with any of the bit error emulation systems and ECC word generators describing this disclosure or with similar systems and ECC word generators.

As indicated by block 404, an error injected ECC word generator, such as generator 120, reads ECC words (raw or base ECC words) from memory devices, such as memory devices 314 shown in FIG. 4. As indicated by block 408, for each of the raw or base error correction code words, generator 120 forms an error pattern (126) having locations corresponding to locations of the ECC word.

As indicated by blocks 412, 414 and 416, the ECC word generator 120 concurrently emulates the random presence of bit errors in digital data being read from memory, the presence of bit errors resulting from a failing memory device or component and the presence of bit errors resulting from write wear out at a predefined memory address. As indicated by block 412, generator 120 forms errors at random locations in the error patterns by injecting bit errors into a set of error patterns. The errors formed at the random locations are such that a set of the ECC words injected with the bit errors based on a corresponding set of the error patterns has a binomial distribution with regard to a number of bit errors in a given ECC word of the set. The errors formed at the random locations of the error patterns are such that set of error injected ECC words also has a predetermined average ratio of bit errors. In one implementation, the predetermined average ratio bit errors consistently provided across each set the words corresponds to the expected average ratio of bit errors for a nonvolatile memory that is to be used with the decoder 50 being evaluated.

As indicated by block 414, to emulate the presence of bit errors resulting from write wear out at a predefined memory location, the ECC word generator 120 concurrently and consistently injects bit errors in those locations of the error patterns corresponding to those ECC words that are read from a predefined memory location of the nonvolatile memory.

As indicated by block 416, to emulate the presence of bit errors resulting from failing memory device or component, the ECC word generator 120 concurrently injects bit errors in those error patterns corresponding to those ECC words read from a selected one of the plurality of memory devices with a number of bit errors greater than a predetermined memory device failure threshold.

As indicated by block 420, bit errors are injected into the raw or base ECC words based upon the error patterns. For example, each error pattern 126 is applied to a corresponding one of ECC words 24. In one implementation, an exclusive or (XOR) operation is applied to the ECC words 24 using the respective error patterns 126. A bit wise XOR process may take two bit patterns of equal length and perform a logical exclusive OR operation on each pair of corresponding bits. The result in each position is one if only the first bit is one or only the second bit is one, but zero if both are zero or both are one.

As indicated by block 422, the candidate decoder/error reporting hardware 50 reads the error injected ECC words. As indicated by block 424, the performance of the ECC decoder is evaluated based upon the error emulations. In one implementation, the performance of the decoder to properly identify the errors may be evaluated. In those implementations where the raw or base ECC words have few or no random bit errors and where the average ratio of bit errors introduced by generator 120 is controlled, a comparison may be made to determine whether the candidate decoder 50 identified and corrected each of the artificially introduced errors injected by generator 120. The identification and correction of bit errors consumes valuable time and processing power. Performance by the candidate decoder 50 may result in processing delays. In one implementation, the overall time consumed by decoder 50 to identify and correct errors for a particular hypothetical nonvolatile memory as well as the processing delays may be evaluated. Such evaluations may prove to be valuable resources for refining the operation of the candidate decoder 50, for selecting a nonvolatile memory for use with a candidate decoder 50, for selecting a particular ECC decoder from a group of candidate decoders and/or for identifying a combination of a decoder and nonvolatile memory that provides enhanced processing results. The more realistic evaluations provided by bit error emulation method 400 facilitates enhanced digital data retrieving systems.

Figure 6:
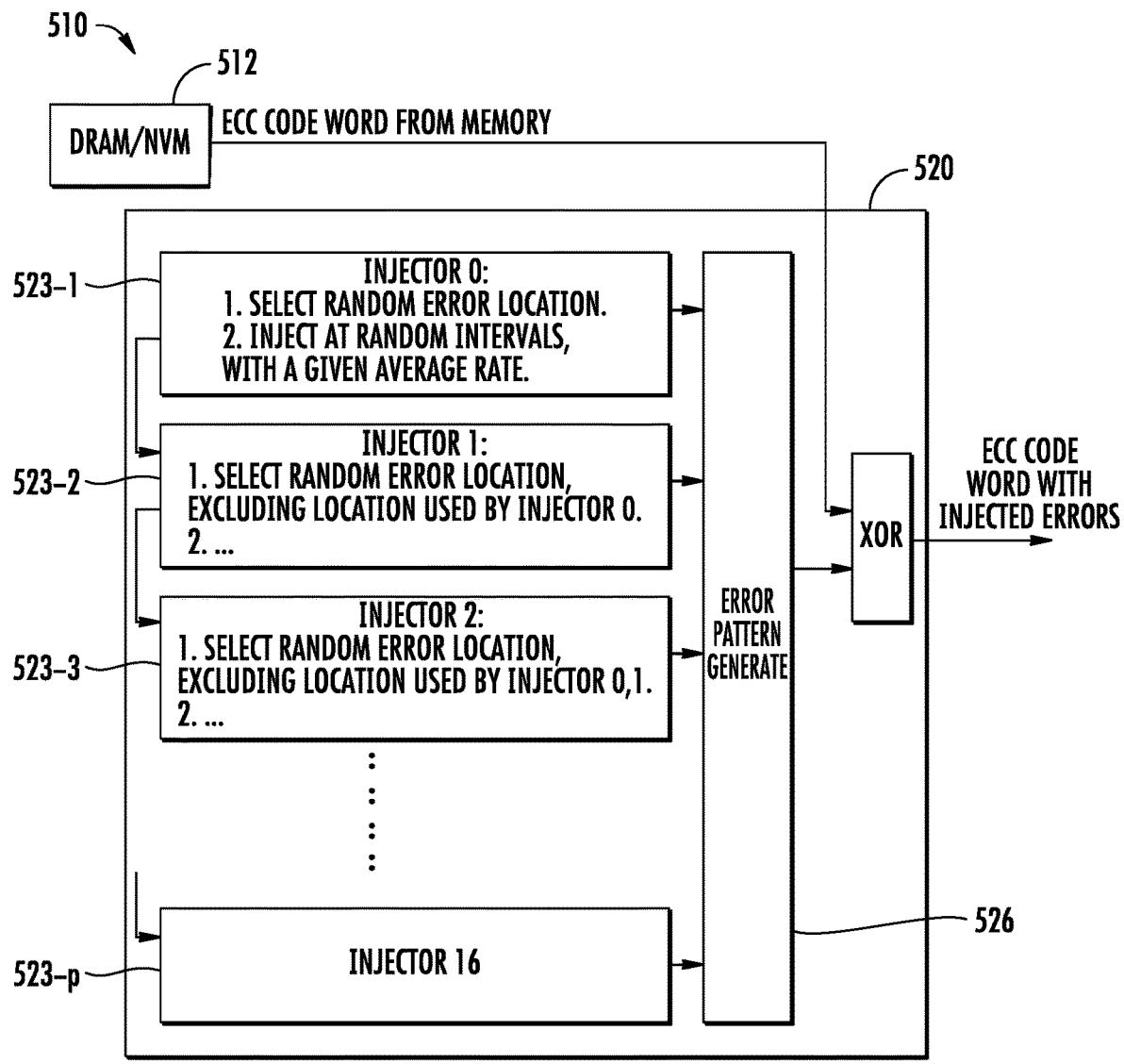
FIG. 6 is a schematic diagram illustrate portions of an example bit error emulation system.

FIG. 6 schematically illustrates an example bit error emulation system 510. System 510 comprises raw or base ECC word source 512 and error injected ECC word generator 520. System 510 may supply error injected ECC words to an ECC decoder/error reporting hardware, such as decoder 50 described above.

ECC word source 512 is similar to ECC word source 312 described above. In one implementation, ECC word source 512 may comprise a series of individual memory devices which form the overall memory from which raw or base ECC words are read by generator 520 or another processing unit. In one implementation, source 512 may comprise multiple dynamic random access memory devices. In yet another implementation, source 512 may comprise multiple individual memory devices that when read, have digital words with few, if any randomly present bit errors. In other implementations, source 512 may comprise other forms of nonvolatile memory which when read provides digital words having predetermined bit error ratios, wherein the bit error ratios are increased when additional errors are introduced by generator 520.

Error injected ECC word generator 520 may be formed on a circuit board and is in the form of an integrated circuit. Generator 520 may comprise a series of parallel error injectors 523-1, 523-2, 523-3 . . . 523-$p$) (collectively referred to as error injectors 523. Each of injectors 523 is connected in parallel to an error pattern generate register 526 which temporally stores an individual error pattern, similar to one of the error patterns 126 described above. The error pattern generate register 526 has a number of locations or bits corresponding to the number of locations or bits in an individual ECC word. The error pattern generator 526 is repeatedly populated with "errors" such that a new error pattern is generated for each ECC word received from source 512.

The parallel injectors 523 cooperate or work in unison to populate each error pattern stored in the error pattern generate register 526. Each of injectors 523 uses a pseudorandom location in the error pattern generator 526 to inject an error. The location is pseudorandom in that the random location is in a location that excludes all of the other pseudorandom locations already selected by the other parallel injectors 523. In one implementation, the injectors 523 are chained together such that each one has unique random error location at any given point in time. Each injector 523 performs injections on its own randomized schedule.

The parallel injectors 523 inject bit errors at random intervals with a given predefined average ratio. In the example illustrated, each of the selected or active parallel injectors 523 inject their respective bit errors such that a set of error patterns and the set of corresponding error injected ECC words have a binomial distribution with regard to a number of the bit errors in a given ECC word of the set. The random intervals at which bit errors are injected are such that the set of error injected error patterns in the corresponding set of error injected ECC words have a predetermined average ratio of bit errors. In other words, for a given number of words in a set having a given size, a predefined percentage of the locations or bits of the total number of bits of the set of words have bit errors.

In some implementations, a particular predetermined average ratio or bit error ratio may be modeled by enabling N of the injectors, with each injector injecting with an average rate (BER*code word size)/N, where the number N places a limit on the number of errors that may be actually injected in a given ECC word. In one implementation, the predetermined average ratio is adjustable. In one implementation, the predetermined average ratio may be adjusted by selectively activating or inactivating some of the injectors 523. In other implementations, the predetermined average ratio may be adjusted by modifying the range of random intervals at which the bit error is injected by injectors 523.

As further shown by FIG. 6, each generated error pattern stored in register 526 is applied to a corresponding ECC word received from source 512. In the example illustrated, logic gates or circuitry is provided to carry out an exclusive or (XOR) operation on the ECC word using the error pattern currently contained in the register 526. The resulting bit error injected word is then transmitted to the ECC decoder, such as ECC decoder 50. This overall process is repeated for each ECC word received from source 512.

Figure 7:
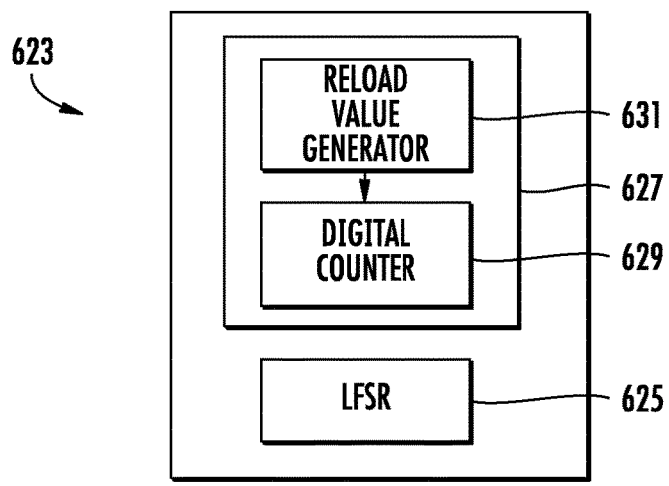
FIG. 7 is a schematic diagram of an example injector for an error injected ECC word generator.

FIG. 7 schematically illustrates an example individual injector 623 which may be provided as part of generator 520, wherein multiple injectors 520 may serve as injectors 523 described above. In other implementations, injectors 523 may take other forms. In the example illustrated, injector 623 comprises an integrated circuit having pseudorandom location selecting circuitry 625 and pseudorandom interval circuitry 627. Pseudorandom location selecting circuitry 625 selects the location to introduce a bit error into an error pattern. In the example illustrated, pseudorandom location selecting circuitry 625 comprises linear feedback shift registers that output a pseudorandom location for the bit error to be injected or locations for multiple bit errors to be injected into each ECC word. Such a location of the error is pseudorandom in that the random location in the error pattern is different for each of the parallel error injectors.

Pseudorandom interval circuitry 627 determines the timing of the random intervals at which a bit error is introduced by the particular injector 623. The introduction of bit errors is controlled such that a set of words will have a binomial distribution with regard to a number of the bit errors in a given ECC word of the set. In addition, the set of error injected ECC words will have a predetermined average ratio of bit errors as discussed above. In the example illustrated, pseudorandom interval circuitry 627 comprises a digital counter 629 which controls the frequency of bit error injection, wherein the digital counter 629 has a counting range. The pseudorandom interval circuitry 627 further comprises a reload value generator 631 that outputs a random frequency counter reload value for the digital counter 629. The pseudorandom frequency counter reload value is limited to a portion of the counting range based upon the predetermined average ratio for the set of ECC words.

Example

For truly random errors, an ECC code word may have 0, 1, 2, ... errors in it, where the probability of a particular number of errors in a code word may be calculated as a binomial distribution, given a certain bit error ratio (BER) and code word size. In one example, a particular nonvolatile memory may have a bit error ratio of 5e-4 (meaning, that on average, 5 out of every 10,000 bits are corrupted). The ECC code word size is 768 bits. As shown by the table presented in FIG. 8, approximately 68% of the code words may have zero errors while approximately 26% of the code words have one error, approximately 5% of the code words will have two errors and so on.

In one implementation, pseudorandomization of the location at which an error is injected by particular injector 523 (or 623) is achieved with various LFSR circuits and some qualification and buffering logic, which may form the pseudorandom location selecting circuitry 625 described above. Bit locations in a 768-bit code word can be defined by a 10-bit value. As a first step, a 160-bit LFSR is used to produce all possible combinations of 16 unique bit locations. Note that for any given 160-bit LFSR state, the 16, 10-bit chunks may not necessarily be unique. There will be occasional periods of time where the 160-bit LFSR state is a pattern which produces very few unique 10-bit values. As a result, a 10-bit LFSR is additionally used, which is "unrolled" such that it produces 16 unique states in parallel per clock cycle. These 160 bits are optionally XORed with the output of the 160-bit LFSR.

Next, the <=16 unique 10-bit values produced by the LFSR circuit are accumulated over multiple clock cycles (as necessary) until 16 unique 10-bit values are collected. Those 16 unique values are then pushed into a FIFO. The FIFO output is presented to each of the 16 parallel error injectors, and that entry is removed from the FIFO whenever an injection occurs.

As discussed above, each of injectors 523 (or 623) perform injections on its own unique schedule with a particular predetermined average rate. In one implementation, the pseudorandom interval selector 627 described above may have a digital counter 629 in the form of an 8-bit frequency counter which increments in any cycle where an ECC code word is seen (provided by source 512). When the digital counter 629 reaches the value 255, an error is injected in the next code word. At such time, the counter is reloaded with a pseudorandom value in a particular range which determines the average ratio of injection. For example, if the frequency counters reload with the pseudorandom value in the range 215-255, that injector will perform an injection on approximately one out of 20 code words.

The frequency counter reload value may be based on a software configured value, which specifies the bottom of the range (e.g. 215). The bottom of range value may be used with various LFSR state to construct a pseudorandom value in the range as:

reload_value[7:0]=range_bottom[7:0]+
(range_bottom[7] ? 0: LFSR_7[6:0])+
(range_bottom[6] ? 0: LFSR_6[5:0])+
(range_bottom[5] ? 0: LFSR_5[4:0])+
(range_bottom[4] ? 0: LFSR_4[3:0])+
(range_bottom[3] ? 0: LFSR_3[2:0])+
(range_bottom[2] ? 0: LFSR_2[1:0])+
(range_bottom[1] ? 0: LFSR_1[0:0])+
pop_count8((range_bottom[7:0] ^ 0xff) & LFSR_8[7:0])).

In one implementation, some of the LFSR state used to construct the 16 unique 10 bit error locations may be reused. For example, initially, the 160 bits may be obtained by XORing the 160 bit LFSR with the unrolled 10 bit LFSR. Thereafter, for injector 523-1 (injector 0) bit 0 may be used for LFSR_1, bits [11:10] for LFSR_2, bits [32:30] for LFSR_3 and so on. Thus, each injector has its own injection schedule, determined by a unique pseudorandom state. In one implementation, the above BER of 5e-4 may be modeled with 14 of such injectors 523.

Although the present disclosure has been described with reference to example implementations, workers skilled in the art will recognize that changes may be made in form and detail without departing from the scope of the claimed subject matter. For example, although different example implementations may have been described as including features providing benefits, it is contemplated that the described features may be interchanged with one another or alternatively be combined with one another in the described example implementations or in other alternative implementations. Because the technology of the present disclosure is relatively complex, not all changes in the technology are foreseeable. The present disclosure described with reference to the example implementations and set forth in the following claims is manifestly intended to be as broad as possible. For example, unless specifically otherwise noted, the claims reciting a single particular element also encompass a plurality of such particular elements. The terms "first", "second", "third" and so on in the claims merely distinguish different elements and, unless otherwise stated, are not to be specifically associated with a particular order or particular numbering of elements in the disclosure.

What is claimed is:

1. A bit error emulation system comprising:
   an error injected error correction code (ECC) word generator that generates a set of ECC code words injected with bit errors for being read by an ECC decoder and error reporting hardware, wherein the set of the error injected ECC words has a binomial distribution with regard to a number of the bit errors in a given ECC word of the set and wherein the set of error injected ECC words has a predetermined average ratio of bit errors.

2. The bit error emulation system of claim 1, wherein the error injected ECC code word generator comprises:
   parallel error injectors, each of the error injectors to output a bit error for a random location of an error pattern to be applied to an error correction code (ECC) word to be read by the ECC decoder and error reporting hardware, wherein each of the injectors is to output the bit error based upon the predetermined average ratio for the set of ECC words, the parallel error injectors collectively inject the bit errors to produce the binomial distribution; and
   an error pattern applicator to flip bits of the ECC word in parallel based on the error pattern.

3. The bit error emulation system of claim 2, wherein the random location of the error pattern at which each error injector is to inject a bit error is different for each of the parallel error injectors.

4. The bit error emulation system of claim 2, wherein the generator controls a number of bit errors that may be injected in the given ECC word based upon a bit error ratio corresponding to a non-volatile memory being emulated.

5. The bit error emulation system of claim 2, wherein the bit error emulation generator comprises:
   an integrated circuit providing the parallel error injectors and the error pattern applicator; and
   a dynamic random access memory from which the set of the ECC words are read.

6. The bit error emulation system of claim 2, wherein each of the error injectors comprises:
   a digital counter to control a frequency of bit error injection, the digital counter having a counting range; and
   circuitry to output a random frequency counter reload value for the digital counter, wherein the random frequency counter reload value is limited to a portion of the counting range based upon the predetermined average ratio for the set of ECC words.

7. The bit error emulation system of claim 2, wherein the error injectors comprise linear feedback shift registers, wherein the linear feedback shift registers output the random location of the error pattern at which each error injector is to inject a bit error, the random location being different for each of the parallel error injectors.

8. The bit error emulation system of claim 2 further comprising the ECC decoder and error reporting hardware.

9. The bit error emulation system of claim 2, wherein the bit error emulation generator is to read error correction code words from a plurality of memory devices of a collective memory, wherein the bit error emulation controller is to inject error correction code words read from a selected one of the plurality of memory devices with a number of bit errors greater than a predetermined memory device failure threshold.

10. The bit error emulation system of claim 2, wherein the bit error emulation generator is to consistently inject a bit error into an address of each error correction code word that that is read from a predefined memory address to emulate a write wear out error at the predefined memory address.

11. A method comprising:
    providing error correction code (ECC) words to be read by an ECC decoder and error reporting hardware; and
    for each of the error correction code words:
      forming an error pattern having locations corresponding to locations of the ECC word by forming errors at random locations of the error pattern; and
      applying the error pattern to the error correction code by flipping bits of those locations of the ECC word that correspond to locations of the error pattern at which a bit error was formed to form an error injected ECC word,
    wherein a set of the error injected ECC words has a given ECC word of the set and wherein the set of error injected ECC words has a predetermined average ratio of bit errors.

12. The method of claim 11, wherein the ECC words are provided by reading the ECC words from a dynamic random access memory.

13. The method of claim 12 further comprising limiting a number of bit errors that may be injected in a given ECC word based upon a bit error ratio, wherein the bit error ratio has a predetermined value based upon expected ratio of errors associated with a non-volatile memory different than the dynamic random access memory.

14. The method of claim 11 further comprising reading the error correction code words from a plurality of memory devices of a collective memory, wherein the method further comprises injecting ECC words read from a selected one of the plurality of memory devices with a number of bit errors greater than a predetermined memory device failure threshold.

15. The method of claim 11, wherein the error correction code words are read from a nonvolatile memory, the method further comprising consistently injecting a bit error in those locations of those ECC words that are read from a predefined memory location of the nonvolatile memory to emulate a write wear out error at the predefined memory location.

16. The method of claim 11, wherein the error pattern is formed by active parallel error injectors, each of the error injectors to output the bit error at the random location of the error pattern.

17. The method of claim 16 further comprising adjusting a number of active parallel injectors for the ECC words to adjust the predetermined average ratio of bit errors.

18. A bit error emulation system comprising:
    a bit error emulation generator comprising:
      parallel error injectors, each of the error injectors to output a bit error for a random location of an error pattern to be applied to an error correction code (ECC) word to be read by an ECC decoder and error reporting hardware, wherein each of the injectors is to output the bit error with a predetermined average ratio for a set of ECC words, the parallel error injectors collectively injecting the bit errors to produce a binomial distribution of a particular number of the bit errors in a given ECC word of the set; and an error pattern applicator to flip bits of the ECC word in parallel based on the error pattern.

19. The bit error emulation system of claim 18, wherein the random location of the error pattern at which each error injector is to inject a bit error is different for each of the parallel error injectors.

20. The bit error emulation system of claim 18, wherein the bit error emulation controller comprises:

an integrated circuit providing the parallel error injectors and the error pattern applicator; and a dynamic random access memory from which the set of the ECC words are read.

* * * * *